United States Patent
Engel et al.

(10) Patent No.: US 9,521,742 B2
(45) Date of Patent: Dec. 13, 2016

(54) MOUNTING BLOCK AND A MOUNTING ASSEMBLY THAT INCORPORATES THE MOUNTING BLOCK

(71) Applicant: Avago Technologies General IP (Singapore) Pte. Ltd., Singapore (SG)

(72) Inventors: Andrew C. Engel, Portola Valley, CA (US); Michael J. Brosnan, Fremont, CA (US); David J. K. Meadowcroft, San Jose, CA (US); Klaus D. Giessler, Menlo Park, CA (US); Paul Yu, Sunnyvale, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 231 days.

(21) Appl. No.: 14/308,773

(22) Filed: Jun. 19, 2014

(65) Prior Publication Data
US 2015/0373834 A1   Dec. 24, 2015

(51) Int. Cl.
| H05K 5/00 | (2006.01) |
| --- | --- |
| H05K 1/02 | (2006.01) |
| H01L 23/373 | (2006.01) |
| H01L 23/367 | (2006.01) |
| H01L 25/065 | (2006.01) |
| H01L 23/498 | (2006.01) |
| H05K 1/18 | (2006.01) |

(Continued)

(52) U.S. Cl.
CPC ......... *H05K 1/0216* (2013.01); *H01L 23/3675* (2013.01); *H01L 23/3736* (2013.01); *H01L 23/49805* (2013.01); *H01L 23/49838* (2013.01); *H01L 25/0655* (2013.01); *H05K 1/111* (2013.01); *H05K 1/181* (2013.01); *H01L 2224/48091* (2013.01); *H01L 2224/48465* (2013.01); *H01L 2224/48471* (2013.01); *H01L 2224/73265* (2013.01)

(58) Field of Classification Search
CPC ............. H05K 2201/09754; H05K 2201/0999; H05K 5/006; H05K 2201/10159; H05K 2201/10674; H05K 2201/10689; G06F 1/1601; G06F 1/184; G06F 15/161
USPC ............... 361/720, 722, 723, 748, 752, 764, 783,361/796, 813; 174/529, 536; 257/666, 668, 672, 257/678, 686
See application file for complete search history.

(56) References Cited

U.S. PATENT DOCUMENTS

| 5,228,192 A * | 7/1993 | Salatino ................. H05K 1/189 174/16.3 |
| --- | --- | --- |
| 2013/0244490 A1 | 9/2013 | Rathburn | |

OTHER PUBLICATIONS

Qing Liu, Quilt Packaging: A Novel High Speed Chip-to-Chip Communication Paradigm for System-in-Package, Dissertation, Graduate Program in Electrical Engineering, Aug. 2007, Notre Dame, Indiana.

(Continued)

*Primary Examiner* — Binh Tran (57) ABSTRACT

A mounting block is provided that has a multi-level upper surface that is used to mount one or more IC chips and the printed circuit board (PCB) thereon at heights that allow the lengths of the bond wires interconnecting the chips with the PCB and/or with the other IC chips to be reduced. The distances between the levels of the multi-level surface are preselected based at least in part on the known height of the PCB and the known height of at least one of the IC chips such that when the chip and the PCB are mounted on the mounting block, the distance between the contact pads of the (Continued)

PCB and the contact pads of the IC chip is very small, thereby allowing the lengths of the bond wires to be kept very short.

20 Claims, 5 Drawing Sheets

(51) Int. Cl.
*H05K 1/11* (2006.01)
*H05K 7/00* (2006.01)

(56) References Cited

OTHER PUBLICATIONS

Eric A Sanjuan and Sean S Cahill, Low-Cost High-Bandwith Millimeter Wave Leadframe Packages, RF and Microwave Microelectronics Packaging, RF and Microwave Microelectronics Packaging, 2010, Chapter 2 pp. 25-42, Springer Science+Business Media, LLC, Santa Clara, CA, USA.

* cited by examiner

MOUNTING BLOCK AND A MOUNTING ASSEMBLY THAT INCORPORATES THE MOUNTING BLOCK

TECHNICAL FIELD OF THE INVENTION

The invention relates to mounting arrangements for circuit boards and IC chips.

BACKGROUND OF THE INVENTION

A parallel optical communications module is a module having multiple transmit (Tx) channels, multiple receive (Rx) channels, or both. A parallel optical transceiver module is an optical communications module that has multiple Tx channels and multiple Rx channels in the Tx and Rx portions, respectively, of the transceiver. A parallel optical transmitter module is an optical communications module that has multiple Tx channels, but no Rx channels. A parallel optical receiver module is an optical communications module that has multiple Rx channels, but no Tx channels.

The Tx portion of a parallel optical communications module comprises components for generating modulated optical signals, which are then transmitted over multiple optical fibers. The Tx portion includes a laser driver circuit and a plurality of laser diodes. The laser driver circuit outputs electrical signals to the laser diodes to modulate them. When the laser diodes are modulated, they output optical signals that have power levels corresponding to logic 1s and logic 0s. An optics system of the transceiver module focuses the optical signals produced by the laser diodes into the ends of respective transmit optical fibers held within a connector that mates with the transceiver module.

The Rx portion of a parallel optical communications module includes a plurality of receive photodiodes that receive incoming optical signals output from the ends of respective receive optical fibers held in the connector. The optics system of the transceiver module focuses the light that is output from the ends of the receive optical fibers onto the respective receive photodiodes. The receive photodiodes convert the incoming optical signals into electrical analog signals. An electrical detection circuit, such as a transimpedance amplifier (TIA), receives the electrical signals produced by the receive photodiodes and outputs corresponding amplified electrical signals, which are processed in the Rx portion to recover the data.

A mid-plane mounting configuration for a parallel optical communications module is one in which the module is mounted on the surface of a host printed circuit board (PCB). The module includes an electronic subassembly (ESA) that includes the PCB and the integrated circuit (IC) chips that are mounted thereon (e.g., laser diode chip, photodiode chip, laser diode driver chip, receiver chip, and controller chip). Traditionally, all of these chips are directly mounted on the upper surface of the PCB. This places all of the chips in the same plane, i.e., the plane defined by the upper surface of the PCB. Some or all of the chips may be mounted on metal heat spreaders or thermal vias formed or embedded in the upper surface of the PCB for dissipating heat. Bond wires are used to electrically connect electrical contact pads of the chips to electrical contact pads of the PCB.

With the traditional mounting approach, the heights of the chips often impose lower limits on the lengths of the bond wires because the contact pads of the chips are typically disposed on the top surfaces of the chips. The heights of the chips are dictated by semiconductor processing and handling limits for the chips. For best signal integrity, the bond wires should be as short as possible. Longer bond wires can lead to undesirable effects, such as, for example, cross-talk between adjacent bond wires, energy dissipation due to path losses associated with bond wires, and relatively large signal path inductances caused by inductive coupling between adjacent bond wires. These undesirable effects can degrade signal integrity.

It would be desirable to provide a mounting solution that removes the lower limits on bond wire lengths imposed by chip heights. Removing the lower limits on bond wire lengths imposed by chip heights would allow the lengths of the bond wires to be reduced, which would allow the undesirable effects caused by long bond wires to be avoided.

SUMMARY OF THE INVENTION

The invention is directed to a mounting block and a mounting assembly that incorporates the mounting block. The mounting block comprises a bottom surface and a multi-level mounting surface. The multi-level upper surface comprises N mounting surfaces, where N is a positive integer that is greater than or equal to 2. The N mounting surfaces include at least a first-level mounting surface and a second-level mounting surface. The bottom surface is connected to the first-level mounting surface by first side walls of the mounting block. The first-level mounting surface is connected to the second-level mounting surface by second side walls of the mounting block. The first-level mounting surface is a first distance, d1, from the bottom surface in a direction generally normal to the first-level mounting surface and to the bottom surface. The second-level mounting surface is a second distance, d2, from the first-level mounting surface in a direction generally normal to the first-level mounting surface and to the second-level mounting surface. The first and second distances d1 and d2, respectively, are preselected such that when a circuit board is mounted on the first-level mounting surface and a first IC chip is mounted on the second-level mounting surface, a top surface of the first IC chip is a first preselected distance from a top surface of the circuit board in a direction generally normal to the top surfaces.

The mounting assembly comprises the mounting block having a multi-level mounting surface comprising N surfaces, a circuit board mounted on the first-level mounting surface of the N mounting surfaces and a first IC chip mounted on the second-level mounting surface of the N mounting surfaces, where N is a positive integer that is equal to or greater than two. The first and second distances d1 and d2, respectively, are preselected such that a top surface of the first IC chip is a first preselected distance from a top surface of the circuit board in a direction generally normal to the top surfaces.

By selecting appropriate values for d1 and d2, the distance between the top surfaces of the circuit board and the first IC chip is preselected to reduce the lengths of the interconnecting bond wires.

These and other features and advantages of the invention will become apparent from the following description, drawings and claims.

DETAILED DESCRIPTION OF AN ILLUSTRATIVE EMBODIMENT

In accordance with the invention, a mounting block is provided that has a multi-level mounting surface that is used to mount the chips and a PCB at different heights that allow the lengths of the bond wires that interconnect chips with the PCB and/or with other chips to be reduced. The distance between the levels of the multi-level surface is preselected based at least in part on the known height of the PCB and the known height of at least one of the chips such that when the chip is mounted on the mounting block, the distance between the electrical contact pads disposed on the PCB and the electrical contact pads disposed on the chip is very small. Reducing this distance, in turn, allows the lengths of the bond wires to be kept very short.

In accordance with an illustrative embodiment, the multi-level mounting surface includes at least a first-level mounting surface that is a first distance, d1, from a bottom surface of the mounting block and a second-level mounting surface that is a second distance, d2, from the first-level mounting surface. The second distance d2 is preselected to be equal to, or approximately equal to, the sum of the height of the PCB and the height of at least a first chip of the ESA. The bottom surface of the PCB is in contact with the first-level mounting surface of the mounting block and has an opening formed therein through which a portion of the mounting block passes that is above the first-level mounting surface and that includes the second-level mounting surface. The cross-section of the mounting block at the opening is complementary in shape to the cross-section of the portion of the mounting block that passes through the cutaway portion such that side walls of the PCB that define the opening are in contact with side walls of the mounting block that extend between the first-level mounting surface and the second-level mounting surface.

The first chip of the ESA is mounted on the second-level mounting surface. Due to the second distance d2 being equal to, or approximately equal to, the sum of the height of the PCB and the height of the first chip, the top surface of the PCB on which electrical contact pads of the PCB are disposed is at about the same height as the top surface of the first chip on which electrical contact pads of the first chip are disposed. The contact pads of the first chip are disposed along a periphery of the top surface of the first chip. The contact pads of the PCB are disposed about a periphery of the opening in the PCB. The relative positioning of the top surfaces of the first chip and of the PCB allows the bond wires that are used to connect the contact pads of the PCB with the contact pads of the first chip to be kept very short.

Generally speaking, the mounting block operates to lower the top surface of the first chip relative to the top surface of the PCB to bring those surfaces closer together, which allows the lengths of the interconnecting bond wires to be reduced. It is impractical to modify the PCB to achieve the relative surface heights needed to accomplish these goals. By using the mounting block for this purpose, several different surface heights can be provided to enable bond wire lengths to be optimized for each set of bond wires, including the bond wires that are used for the high-speed signal paths and ground returns. By shortening the bond wires in this manner for the high-speed signal paths and ground returns, an overall signal path improvement is provided that doubles for each unit decrease in bond wire length. In addition, the mounting block can also be used to provide all of these same benefits for chip-to-chip bond wire interconnections.

In addition, in accordance with an illustrative embodiment, the mounting block is made of a material having a high thermal conductivity, such as copper, for example. Making the mounting block of such a material allows the mounting block to act as a heat spreader for spreading heat away from the components of the ESA and dissipating the heat, which helps ensure that the chips of the ESA operate within acceptable temperature ranges. The combination of benefits achieved by reducing the lengths of the bond wires and by improving heat dissipation helps to ensure good signal integrity and good overall performance of the optical communications module. Illustrative embodiments of the mounting block, of an optical communications module that incorporates the mounting block, and a method of using the mounting block will now be described with reference to the figures, in which like reference numerals identify like features, elements or components. It should be noted that features, elements or components in the figures are not necessarily drawn to scale.

Figure 1:
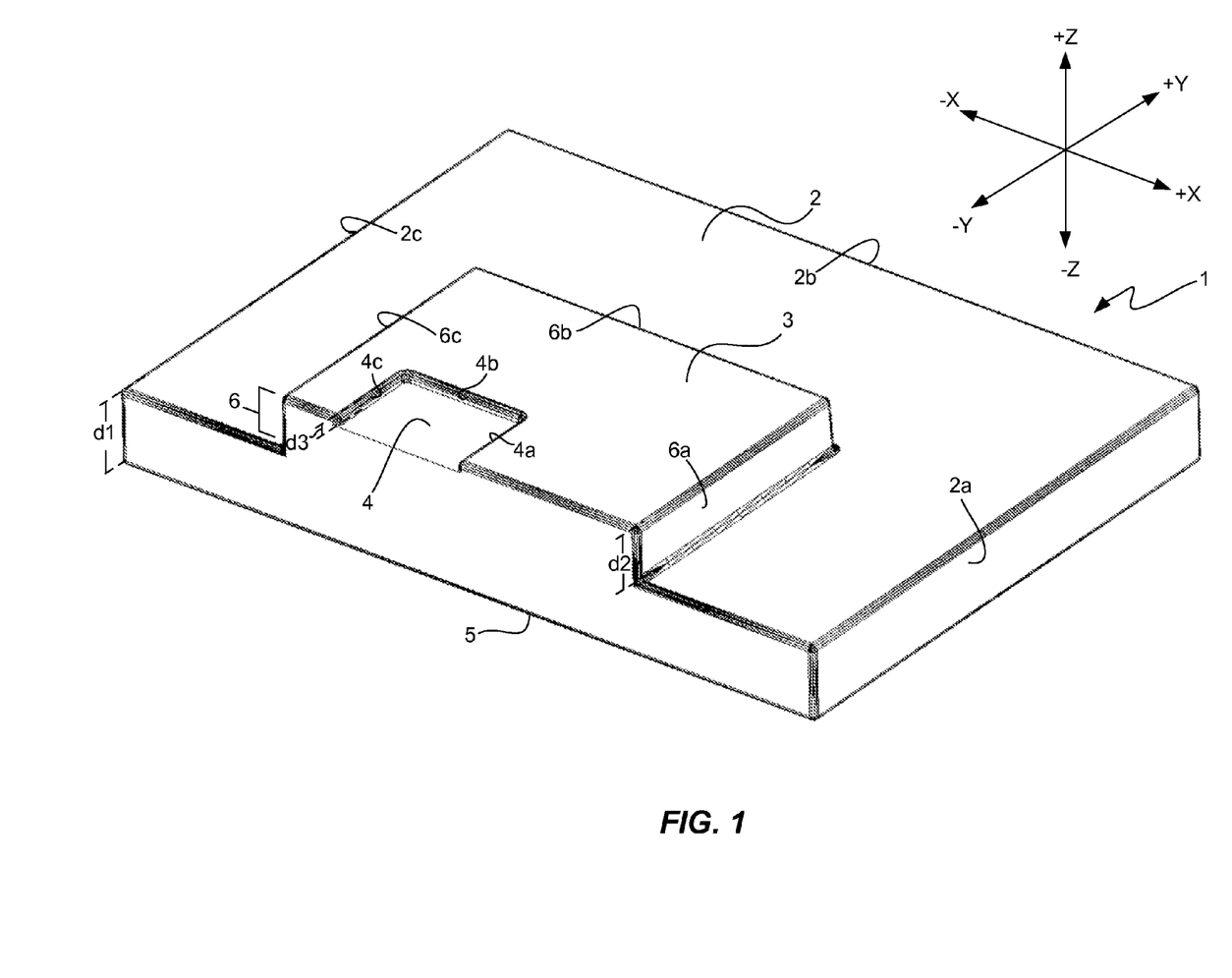
FIG. 1 illustrates a perspective view of the mounting block in accordance with an illustrative embodiment.

FIG. 1 illustrates a perspective view of the mounting block 1 in accordance with an illustrative embodiment. In accordance with this embodiment, the multi-level mounting surface of the mounting block 1 is made up of three mounting surfaces, namely, a first-level mounting surface 2, a second-level mounting surface 3 and a third-level mounting surface 4. The first-level mounting surface 2 is a first distance, d1, above a bottom surface 5 of the mounting block 1. The second-level mounting surface 3 is a second distance, d2, above the first-level mounting surface 2. As indicated above, the second distance d2 is preselected to be equal to, or approximately equal to, the sum of the height of the PCB (not shown) and the height of at least a first chip (not shown), as will be described below in more detail with reference to FIG. 2. In accordance with this embodiment, the third-level mounting surface 4 is a third distance, d3, below the second-level mounting surface 3.

The portion 6 of the mounting block 1 that extends above the first-level mounting surface 2 and that includes the second-level mounting surface 3 has side walls 6a, 6b and 6c that extend between the first-level mounting surface 2 and the second-level mounting surface 3. The mounting block 1 has side walls 4a, 4b and 4c that extend between the second-level mounting surface 3 and the third-level mounting surface 4. The mounting block 1 has side walls 2a, 2b and 2c that extend between the first-level mounting surface 2 and the bottom surface 5. In accordance with this illustrative embodiment, the surfaces 2-5 are parallel to one another and lie in respective X-Y planes of an X, Y, Z Cartesian Coordinate System. For purposes of discussion, it will be assumed that the X-Y plane in which the bottom surface 5 of the mounting block 1 lies has a Z coordinate value of 0. Thus, all of the other mounting surfaces 2, 3 and 4 lie in X-Y planes that have positive Z coordinate values that are greater than 0. The first-level mounting surface 2 is above the bottom surface 5 in the +Z direction, the second-level mounting surface 3 is above the first-level mounting surface 2 in the +Z direction, and the third-level mounting surface 4 is above the first-level mounting surface 2 in the +Z direction and is below the second-level mounting surface 3 in the +Z direction.

For ease of illustration and discussion, the mounting block 1 is shown as having only the three mounting surface 2, 3 and 4, although it could have any number of mounting surfaces ranging from 2 to N, where N is a positive integer that is greater than 2. Also, although all of the mounting surfaces 2-4 are depicted as being parallel to one another, this is typically, but not necessarily, the case. The mounting block 1 is typically a molded, stamped or coined piece part. While parallel surfaces are easier to form by these processes, angled surfaces and curved surfaces may also be formed by these processes.

Figure 2:
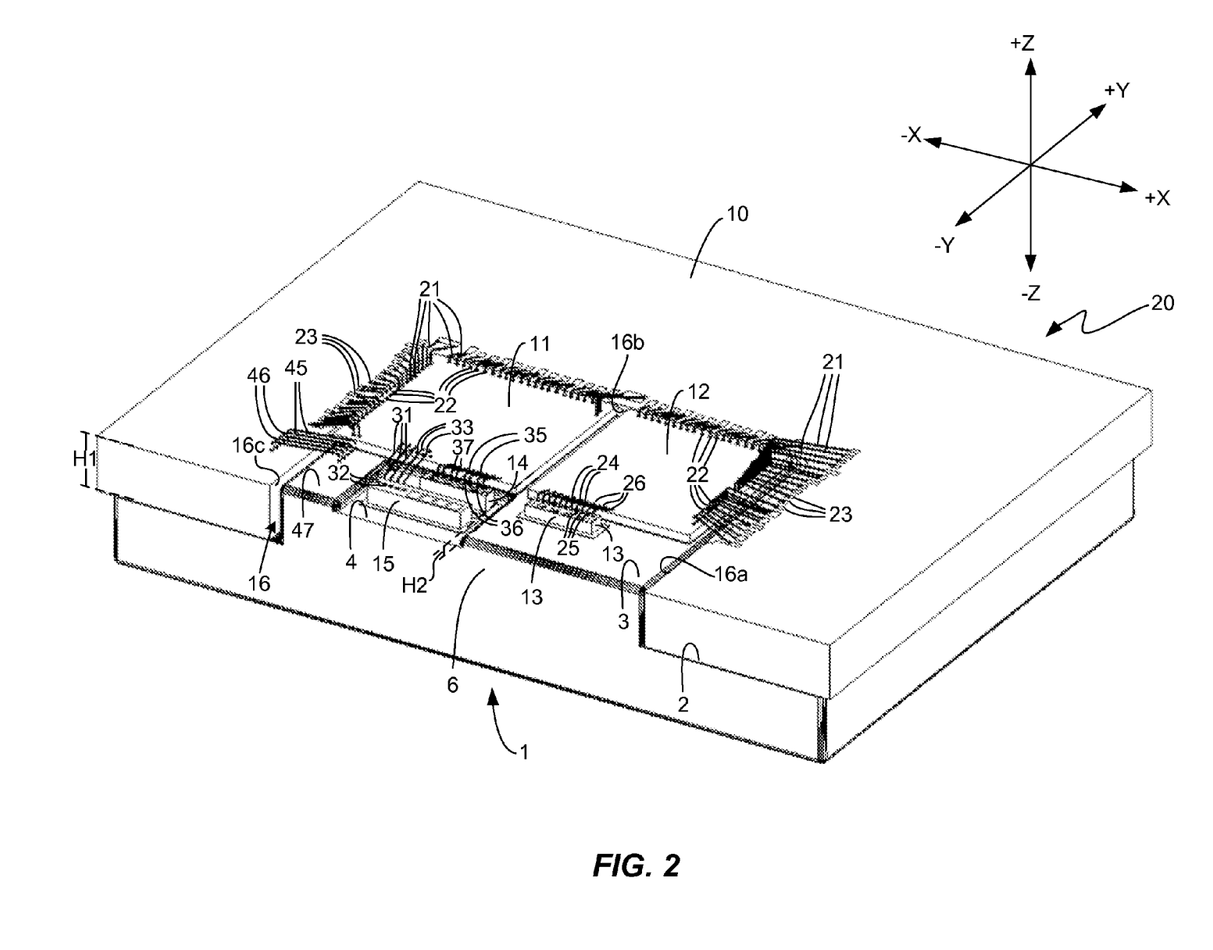
FIG. 2 illustrates a perspective view of an ESA that includes the mounting block shown in FIG. 1, a PCB mounted on the mounting block and a variety of chips mounted on the mounting block.
Figure 4:
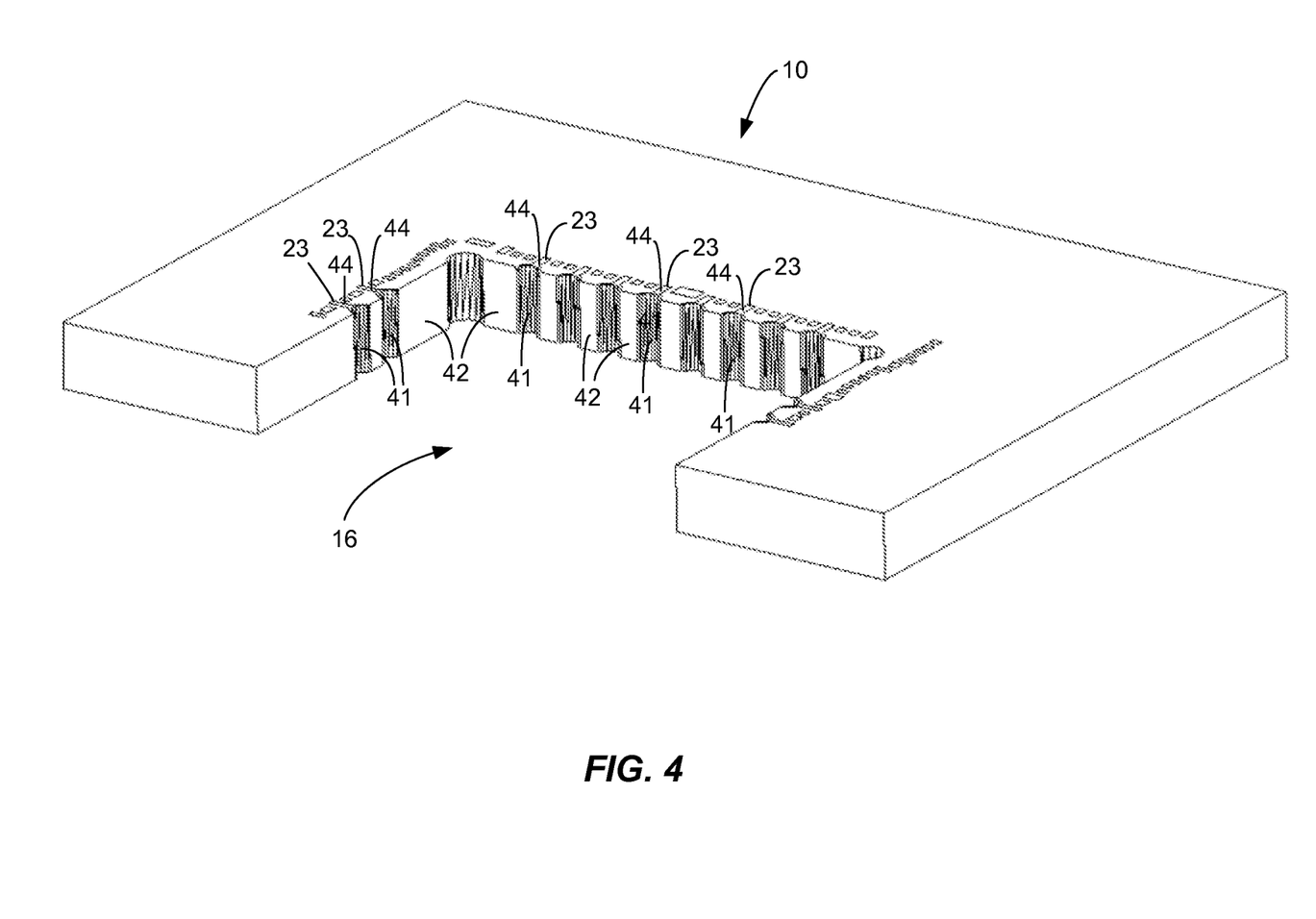
FIG. 4 illustrates a top perspective view of a PCB in accordance with an illustrative embodiment that can be used in the ESA shown in FIGS. 2 and 3.
Figure 5:
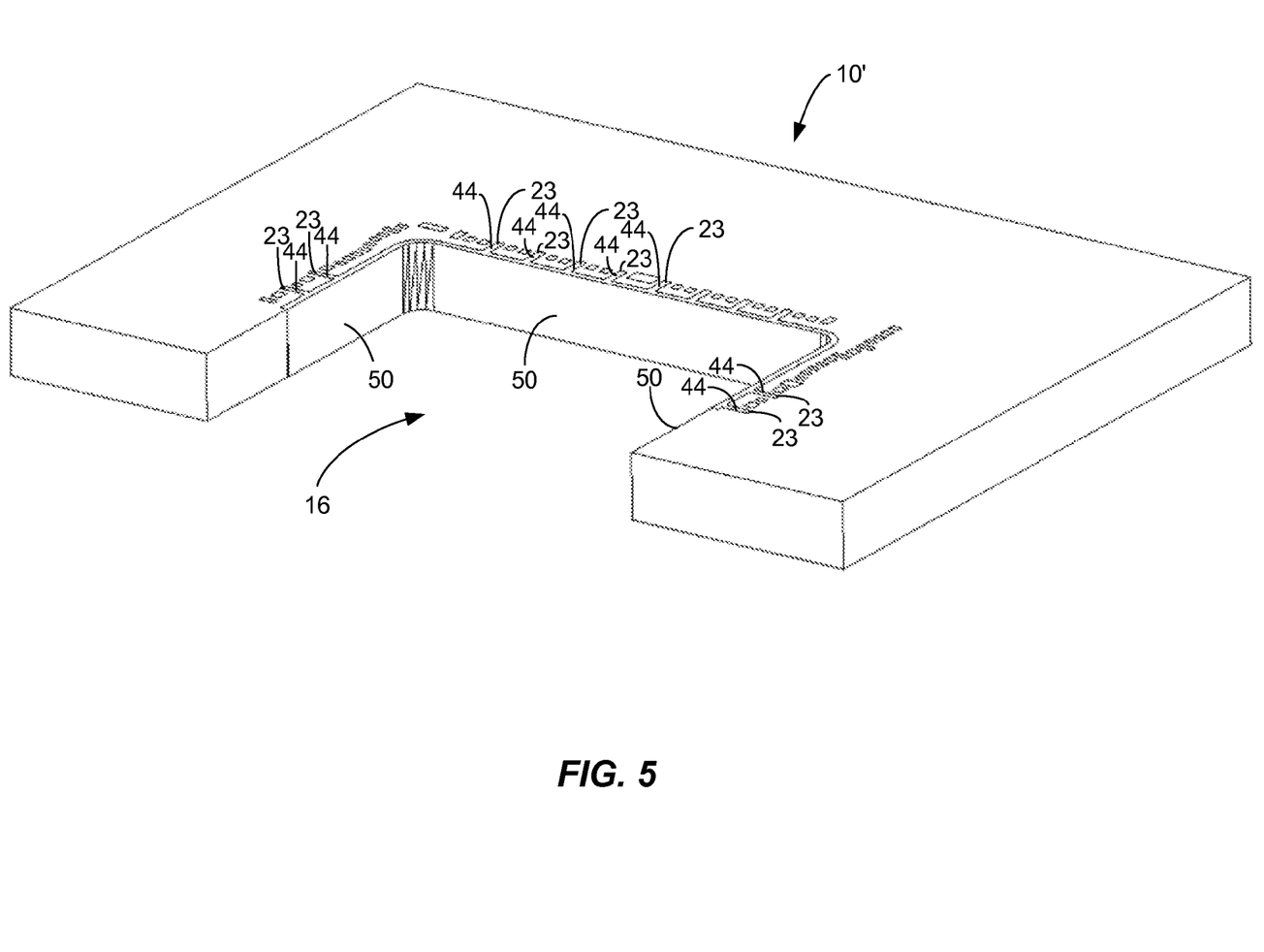
FIG. 5 illustrates a top perspective view of a PCB in accordance with another illustrative embodiment that can be used in the ESA shown in FIGS. 2 and 3.

FIG. 2 illustrates a perspective view of an ESA 20 that includes the mounting block 1 shown in FIG. 1, a PCB 10 mounted on the mounting block 1 and a variety of chips 11-15 mounted on the mounting block 1. The PCB 10 is mounted on the first-level mounting surface 2 of the mounting block 1. The chips 11-13 are mounted on the second-level mounting surface 3 of the mounting block 1. The chips 14 and 15 are mounted on the third-level mounting surface 4 of the mounting block 1. The PCB 10 has an opening 16 formed therein. FIGS. 4 and 5 illustrate top perspective views of the PCB 10 in accordance with illustrative embodiments, both of which have the opening 16 formed therein. In accordance with these illustrative embodiments, the opening 16 is a U-shaped opening. The embodiments shown in FIGS. 4 and 5 depict two different alternative configurations of materials and features disposed on the inner surfaces that define the opening 16, as will be described below with reference to FIGS. 4 and 5.

The chips 11-15 may be, for example, a laser diode driver IC chip, a receiver IC chip, a photodiode array chip, a laser diode array chip, and a monitor photodiode array chip, respectively. The laser diode array chip 14 is typically a vertical cavity surface emitting laser diode (VCSEL) array chip. The photodiode array chip 13 and the monitor photodiode array chips 13 and 15, respectively, are typically P-intrinsic-N diode array chips. The invention is not limited with respect to the types of chips that are mounted on the mounting block 1.

The opening 16 in the PCB 10 is generally complementary in shape and size to the portion 6 of the mounting block 1 that passes through the opening 16 such that the side walls 6a, 6b and 6c (FIG. 1) of the portion 6 of the mounting block 1 are in proximity to inside walls 16a, 16b and 16c (FIG. 2), respectively, of the opening 16. Typically, the side walls 6a, 6b and 6c (FIG. 1) of the portion 6 of the mounting block 1 are in contact with the inside walls 16a, 16b and 16c (FIG. 2), respectively, of the PCB 10 for reasons that will be described below with reference to FIGS. 4 and 5.

Electrically-conductive bond wires 21 are connected on first ends thereof to electrical contact pads 22 disposed on the top surfaces of the chips 11 and 12 and are connected on second ends thereof to electrical contact pads 23 disposed on the upper surface of the PCB 10. The contact pads 22 of the chips 11 and 12 are disposed on the top surfaces of the chips 11 and 12 near the edges of the chips 11 and 12. The contact pads 23 of the PCB 10 are disposed on the top surface of the PCB 10 near the edges of the opening 16. Locating these contact pads 22 and 23 near the edges of the chips 11 and 12 and near the edges of the opening 16, respectively, ensures that the pads 22 are in proximity to the respective pads 23 in the X and Y dimensions.

The top surface of the PCB 10 and the top surfaces of the chips 11 and 12 are in approximately the same X-Y plane, but the X-Y plane in which the top surfaces of the chips 11 and 12 lie is above (i.e., in the +Z direction) the X-Y plane in which the top surface of the PBC 10 lies. The reasons for the offset of these planes in the Z direction will be described below with reference to FIG. 3. For ease of discussion, it is assumed that the top surfaces of the chips 11 and 12 lie in the same X-Y plane, although this is not necessarily the case. The proximity in the Z dimension of the top surface of the PCB 10 to the top surfaces of the chips 11 and 12 and the proximity of the contact pads 22 of the chips 11 and 12 to the respective contact pads 23 of the PCB 10 in the X and Y dimensions enables the lengths of the bond wires 21 to be kept very short.

The proximity in the Z dimension of the top surface of the PCB 10 to the top surfaces of the chips 11 and 12 is achieved by selecting a value for the distance d2 (FIG. 1) that is based at least in part on the height, H1 (FIG. 2), of the PBC 10 and on the height, H2 (FIG. 2), of either of the chips 11 and 12 that are mounted on the second-level mounting surface 3. In other words, when the mounting block 1 is made, the distance d2 between the first-level mounting surface 2 and the second-level mounting surface 3 is made to be approximately equal to, but slightly greater than, the difference between H1 and H2. This ensures that the top surfaces of the chips 11 and 12 will be above the top surface of the PBC 10 by a very small amount in the +Z direction. The reason for this offset in the +Z direction will be explained below with reference to FIG. 3.

In accordance with this illustrative embodiment, the height of the chip 13 (FIG. 2) is approximately equal to, but slightly greater than, the height of chip 12 (FIG. 2) such that no additional offset in the Z dimension between the top surfaces of these chips is needed. For this reason, both of the chips 12 and 13 are mounted on the second-level mounting surface 3. First ends of electrical bond wires 24 are connected to electrical contact pads 25 of the chip 13 and second ends of the bond wires 24 are connected to electrical contact pads 26 disposed on the upper surface of the chip 12.

The third-level mounting surface 4 is a distance d3 (FIG. 1) below the second-level mounting surface 3. In other words, the third-level mounting surface 4 has a Z coordinate value that is less than the Z coordinate value of the second-level mounting surface 3. The purpose for this Z offset is to lower chip 15 relative to chip 11 in the Z dimension so that the top surface of chip 11 is slightly above the top surface of chip 15 in the Z dimension. In this illustrative embodiment, it is assumed that the chip 15 has a height, H3, that is so much greater than the height, H2, of the chip 11 that mounting the chips 11 and 15 on the same mounting surface (e.g., second-level surface 3) would result in the interconnecting bond wires being too long. In order to position the top surface of the chip 15 slightly below the top surface of chip 11 in the Z dimension, the distance d3 (FIG. 1) between the third-level mounting surface 4 and the second-level mounting surface 3 is preselected to be approximately equal to, but slightly greater than, the difference between H3 and H2. The mounting block 1 is made with the second-level and third-level mounting surfaces 3 and 4 separated by the distance d3 to achieve the proper offset in the Z dimension between the top surfaces of the chips 11 and 15.

First ends of electrical bond wires 31 are connected to electrical contact pads 32 of the chip 15 and second ends of the bond wires 31 are connected to electrical contact pads 33 disposed on the upper surface of the chip 11. The offset in the Z dimension achieved by mounting the chips 11 and 15 on the second-level and third-level mounting surfaces 3 and 4, respectively, allows the lengths of the bond wires 31 to be kept extremely short.

The heights of chips 11 and 14 are such that mounting the chip 14 on the third-level mounting surface 4 places the top surface of chip 14 slightly above the top surface of chip 11 in the Z dimension, which enables bond wires 35 that interconnect the chips 11 and 14 to be kept very short. First ends of the bond wires 35 are connected to electrical contact pads 36 of chip 14 and second ends of the bond wires 35 are connected to contact pads 37 of chip 11.

Figure 3:
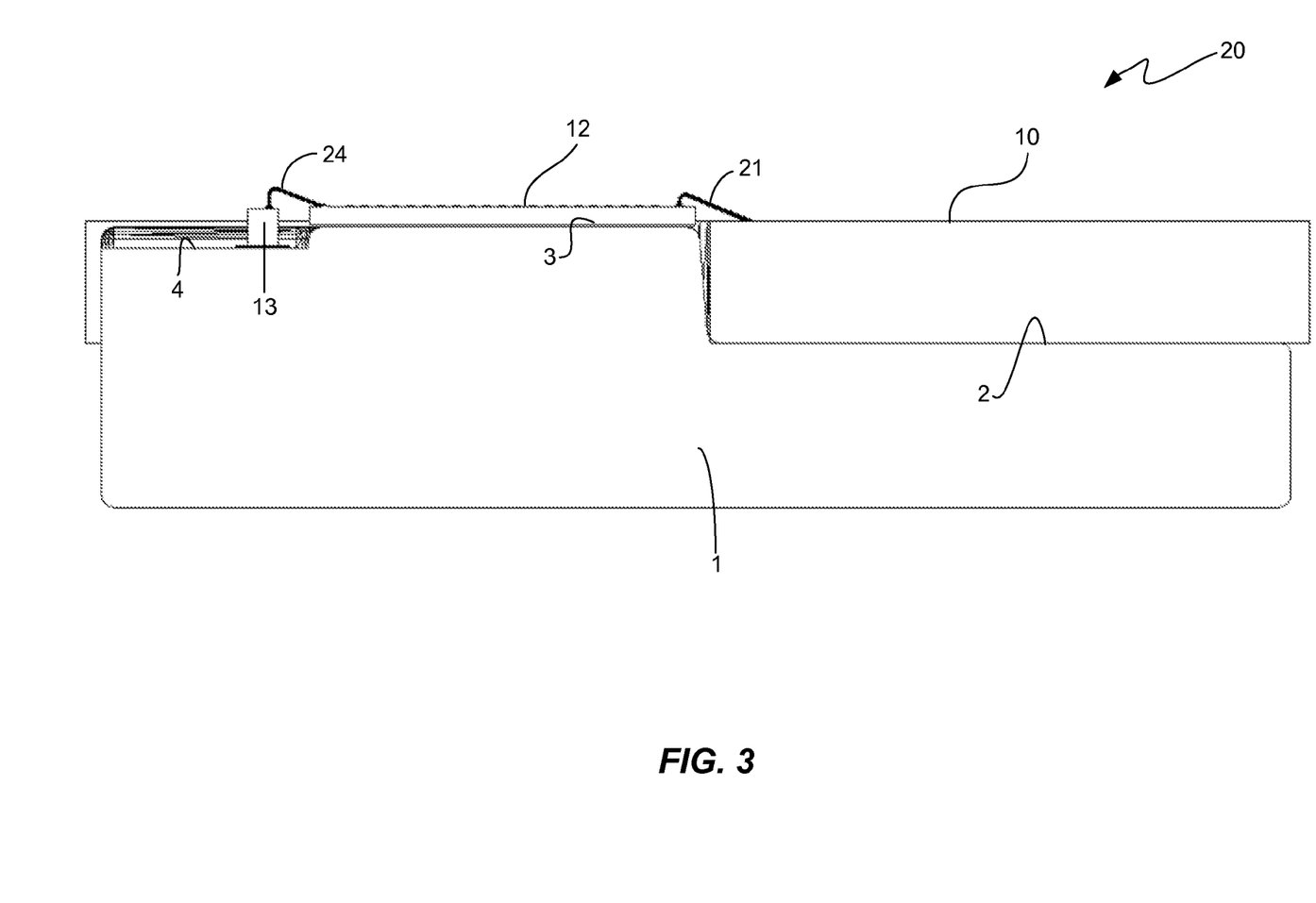
FIG. 3 illustrates a side plan view of the ESA shown in FIG. 2 that shows the relative heights of the top surfaces of PCB and some of the chips of the ESA and that shows bond wires that interconnect them.

FIG. 3 illustrates a side plan view of the ESA 20 shown in FIG. 2 that shows the relative heights of the top surfaces of PCB 10, chip 12 and chip 13, and the bond wires that interconnect them. In the side plan view, it can be seen that the bond wires 24 and 21 angle downwardly as they extend from the higher top surfaces of chips 13 and 12, respectively, to the lower top surfaces of chip 12 and PCB 10, respectively. The bond wires 24 and 21 are directed upwardly, normal to the top surfaces of chips 13 and 12, respectively, before turning and angling downwards toward the top surfaces of chip 12 and PCB 10, respectively. This shape of the bond wires 21 and 24 is due to the process by which bond wires are formed. With typical wire bonding processes, the bond wire is drawn upward after being attached on one end to a contact pad before the wire is angled downward and attached on its opposite end to another contact pad. This process gives the bond wires the shapes depicted in FIG. 3.

Due to the bond wires having this shape when they are formed, the top surface of the chip on which the end of the bond wire is first attached needs to be slightly higher than the top surface of the chip or PCB on which the opposite end of the bond wire is attached. For this reason, the mounting surfaces 2, 3 and 4 of the mounting block 1 are positioned relative to one another based at least in part on the heights of the chips 11-15 and on the height of the PCB 10. This ensures that when the chips 11-15 and the PCB 10 are mounted on the mounting block 1, the top surfaces of the chips 11-15 and of the PCB 10 are offset in the Z dimension by amounts that facilitate the wire bonding process and that allow the lengths of the bond wires to be kept very short.

It should be noted that if a wire bonding process is used that is not facilitated by the surfaces containing the contact pads being at different Z coordinates, then the relative positions of the mounting surfaces 2, 3 and 4 do not need to be selected to cause the top surfaces of the chips 11-15 and of the PCB 10 to be offset from one another in the Z dimension. In general, the relative positioning of the mounting surfaces 2, 3 and 4 is preselected taking into account the wire bonding process such that when the chips 11-15 and the PCB 10 are mounted on the mounting block 1, the top surfaces of the chips 11-15 and of the PCB 10 have Z coordinates that facilitate the wire bonding process and allow the lengths of the bond wires to be kept very short. The Z coordinates may be the same or different.

FIG. 4 illustrates a top perspective view of the PCB 10 shown in FIGS. 2 and 3 in accordance with an illustrative embodiment. In accordance with this embodiment, the U-shaped opening 16 in the PCB 10 is castellated by forming cutaway areas, or grooves, 41 in the inside walls 16a-16c of the PCB 10. The grooves 41 are separated by flat areas 42 on the inside walls 16a-16c. The sequence of grooves 41 and flat areas 42 forms a castellation along the inside walls 16a-16c of the U-shaped opening. When the PCB 10 is mounted on the mounting block 1, the flat areas 42 abut the side walls 6a-6c (FIG. 1) of portion 6 of the mounting block 1 that passes within the U-shaped opening 16.

The grooves 41 are lined with an electrically-conductive material such as gold, for example, and are filled with an electrically-conductive epoxy (not shown). The epoxy is in contact with the electrically-conductive lining of the grooves 41 and with the side walls 6a-6c of the portion 6 of the mounting block 1. Each of the lined grooves 41 is connected by an electrically-conductive trace 44 to one of the contact pads 23 disposed on the top surface of the PCB 10. The electrical pathways made up of the respective contact pad 23, the respective trace 44, the respective lined groove 41, the respective electrically-conductive epoxy disposed in the respective lined groove 41, and the respective points of contact between the epoxy and the side walls 6a, 6b or 6c of the portion 6 of the mounting block 1 constitute respective electrical ground return pathways. It can be seen in FIG. 4 that each of these electrical ground return pathways is very short, which helps improve signal integrity. In addition, because of the relatively large interface between the side walls 6a-6c of portion 6 of the mounting block 1 (FIG. 1) and the inside walls 16a-16c of the U-shaped opening 16 formed in the PCB 10, many of these ground return pathways can be achieved, which further improves signal integrity. An alternative to these ground return pathways is to form these ground return pathways of bond wires 45 (FIG. 2) interconnecting electrical contact pads 46 (FIG. 2) on the top surface of the PCB 10 with a surface 47 (FIG. 2) of the mounting block 1.

FIG. 5 illustrates a top perspective view of a PCB 10' in accordance with another illustrative embodiment that can be used with the ESA 20. In accordance with this embodiment, the U-shaped opening 16 of the PCB 10 is plated with a metallic plating material 50, such as gold, for example. Electrically-conductive traces 44 interconnect some of the contact pads 23 disposed on the top surface of the PCB 10 with the metallic plating material 50. The metallic plating material 50 is in continuous contact with the side walls 6a-6c of the portion 6 of the mounting block 1, thereby completing ground return pathways from the contact pads 23, over the respective traces 44, through the metallic plating material 50 and into the side walls 6a, 6b or 6c of the mounting block 1. As in FIG. 4, each of these ground return pathways is very short, which helps improve signal integrity. In addition, because of the relatively large interface between the side walls 6a-6c of portion 6 of the mounting block 1 (FIG. 1) and the metallic plating material 50, a large number of these ground return pathways can be achieved, which further improves signal integrity.

As indicated above, another benefit of the mounting block 1 is that, because it is typically made entirely or at least partially of a metal material, it can act as a heat sink or heat spreader device for spreading and dissipating heat that is generated by the chips mounted thereon. In order to meet reliability requirements for VCSELs, the temperature of the substrate on which it is mounted must be strictly controlled. As data rates increase and package sizes decrease, it is becoming increasingly difficult to effectively dissipate heat that is generated by the ICs that are often mounted close to the VCSEL, or VCSEL array. In the past, thermal vias and large copper ground planes were used to cool down the VCSELs, but such solutions have proven to be insufficiently effective for higher data rates and increased numbers of channels.

Attempts to provide more effective heat dissipation solutions include mounting the chips on the top surface of a block of metal that acts as a heat spreader. However, these top-mounted heat-spreader solutions introduce several limitations, including limiting access to wire-bond pads and reducing signal integrity performance by extending wire-bond length. Making the block thicker in order to dissipate more heat resulted in increasing the distance between the top surface of the chips and the top surface of the PCB, which increased bond wire lengths and reduced signal integrity. Also, increasing this distance makes it more difficult for the wire-bonder collet to complete the wire bonding process due to more limited access to the contact pads of the PCB.

Because the thickness of the mounting block 1 has no effect on the distance between the contact pads of the chips and the contact pads of the PCB, the mounting block 1 can be made sufficiently thick to accomplish heat dissipation goals without increasing bond wire lengths and without making it more difficult for the wire-bonder collet to access the contact pads. In addition, the base of the mounting block 1 (i.e., the portion between the bottom surface 5 and the first-level mounting surface 2) and the portion 6 (FIG. 1) can be used to spread and dissipate heat. With known heat spreaders that are mounted on top of the PCB, openings in the base of the heat spreader are necessary in order to make the bond wire interconnections between the contact pads of the chips and the contact pads of the PCB.

In contrast, in the illustrative embodiment of the mounting block 1 shown in FIGS. 1-3, heat generated by the chips 11-15 passes down into the portion 6 of the mounting block 1 and then passes into the base of the mounting block 1 where it spreads out and is dissipated. Likewise, heat generated by components (not shown) that are mounted on the PCB 10 passes into the base of the mounting block 1 where it spreads out and is dissipated. Thus, the entire mounting block 1, including the base portion below the PCB 10, is available for spreading out and dissipating heat, which results in improved thermal performance.

Also, with known heat spreaders that are mounted on top of the PCB, there is a risk of the heat spreader electrically shorting traces of the PCB and increasing the capacitance of the traces. Because the PCB 10 is mounted on the mounting block 1, rather than vice versa, the risks of electrical shorts and increased capacitance are eliminated.

It should be noted that the configurations of the mounting block 1 and of the PCBs 10, 10' may be different from the configurations that are shown in the figures and described above. For example, other embodiments may incorporate a PCB that does not have a U-shaped opening 16. The U-shaped opening 16 is one way of bringing the contact pads of the PCB into proximity with the contact pads of the chips, but there are other ways in which this can be accomplished, as will be understood by those of skill in the art in view of the description being provided herein. The mounting block 1 may have any number of levels greater than or equal to two, and the levels may be separated by any distances that are needed in order to bring the contact pads of the chips and the contact pads of the PCB and/or of other chips in proximity to one another. It should also be noted that although the embodiments of the mounting block have been described with respect to use in an optical communications module, the mounting block is well suited for use with any mounting assembly in which bond wires are used to make chip-to-PCB and/or chip-to-chip interconnections.

The illustrative embodiments described above are merely examples that are intended to demonstrate the principles and the concepts of the invention. Many modifications may be made to the embodiments described while still achieving the goal of the invention. All such modifications are within the scope of the invention.

What is claimed is:

1. A mounting assembly for mounting a circuit board and one or more integrated circuit (IC) chips thereon, the mounting assembly comprising:
   a mounting block comprising a bottom surface and a multi-level mounting surface, the multi-level upper surface comprising N mounting surfaces, where N is a positive integer that is greater than or equal to 2, said N mounting surfaces including at least a first-level mounting surface and a second-level mounting surface, the bottom surface being connected to the first-level mounting surface by first side walls of the mounting block, the first-level mounting surface being connected to the second-level mounting surface by second side walls of the mounting block, the first-level mounting surface being a first distance, d1, from the bottom surface in a direction generally normal to the first-level mounting surface and to the bottom surface, the second-level mounting surface being a second distance, d2, from the first-level mounting surface in a direction generally normal to the first-level mounting surface and to the second-level mounting surface;
   at least a first electrical component mounted on the second-level mounting surface; and
   a circuit board mounted on the first-level mounting surface, and wherein the first and second distances d1 and d2, respectively, are preselected such that a top surface of the first IC chip is a first preselected distance from a top surface of the circuit board in a direction generally normal to the top surfaces, wherein a bottom surface of the circuit board is in contact with the first-level mounting surface, and wherein the bottom surface of the circuit board is connected to a top surface of the circuit board by side walls of the circuit board, and wherein a cutaway portion of the circuit board forms an opening in the circuit board that is definable by the inside walls of the circuit board, and wherein the inside walls of the circuit board surround the second side walls that connect the first-level mountain surface to the second-level mounting surface, and wherein electrical contact pads of the circuit board are disposed on the top surface of the circuit board adjacent the inside walls of the circuit board, and wherein the electrical contact pads of the first IC chip are disposed on the top surface of the first IC chip about a peripheral portion of the first IC chip that is adjacent the opening formed in the circuit board.

2. The mounting assembly of claim 1, wherein the opening formed in the circuit board is a U-shaped opening and wherein the inside walls of the circuit board are first, second and third inside walls, and wherein each of the second side walls of the mounting block is adjacent one of the first, second and third inside walls of the circuit board.

3. The mounting assembly of claim 2, wherein at least portions of the first, second and third inside walls of the U-shaped opening formed in the circuit board are in contact with portions of the second side walls of the mounting block.

4. The mounting assembly of claim 3, wherein the first, second and third inside walls of the circuit board have a castellation formed therein where portions of the inside walls of the circuit board have been removed to form grooves in the inside walls of the circuit board in directions generally normal to the top and bottom surfaces of the circuit board, the grooves formed in the inside walls being separated by flat portions of the inside walls, and wherein an electrically-conductive adhesive material is disposed in the grooves, and wherein the flat portions of the inside walls and the electrically-conductive adhesive material disposed in the grooves are in contact with the adjacent second side walls of the mounting block, and wherein the mounting block is made of a metallic material or is plated with a metallic material.

5. The mounting assembly of claim 4, wherein each of the grooves is connected to an electrically-conductive trace of the circuit board and wherein each of the electrically conductive traces is part of an electrical ground return path of the mounting assembly.

6. The mounting assembly of claim 5, wherein the grooves are lined with a metallic material.

7. The mounting assembly of claim 3, wherein the first, second and third inside walls of the circuit board are flat and have a metallic material thereon, and wherein an electrically-conductive adhesive material is disposed on the metallic material.

8. The mounting assembly of claim 1, wherein the bottom surface, the first-level mounting surface and the second-level mounting surface lie in respective X-Y planes of an X, Y, Z Cartesian Coordinate system, and wherein the directions generally normal to the bottom surface, the first-level mounting surface and the second-level mounting surface are the Z direction.

9. The mounting assembly of claim 8, wherein the direction generally normal to the top surfaces of the first IC chip and the circuit board is the Z direction.

10. The mounting assembly of claim 9, wherein the top surface of the first IC chip is a third distance, d3, from the bottom surface of the mounting block in the Z direction, and wherein the top surface of the circuit board is a fourth distance, d4, from the bottom surface of the mounting block in the Z direction, and wherein d3 is greater than or equal to d4.

11. The mounting assembly of claim 9, wherein the top surface of the first IC chip is a third distance, d3, from the bottom surface of the mounting block in the Z direction, and wherein the top surface of the circuit board is a fourth distance, d4, from the bottom surface of the mounting block in the Z direction, and wherein d3 is greater than d4.

12. The mounting assembly of claim 1, wherein the multi-level upper surface further comprises at least a third-level mounting surface, the third-level mounting surface being connected to the second-level mounting surface by third side walls of the mounting block, the third-level mounting surface being a third distance, d3, from the bottom surface in a direction generally normal to the third-level mounting surface and to the bottom surface, and wherein the mounting assembly further comprises:

a second IC chip mounted on the third-level mounting surface, and wherein the first, second and third distances d1, d2 and d3, respectively, are preselected such that when the circuit board is mounted on the first-level mounting surface, the first IC chip is mounted on the second-level mounting surface and a second IC chip is mounted on the third-level mounting surface, a top surface of the second IC chip is a second preselected distance from the top surface of the first IC chip in a direction generally normal to the top surfaces and such that the top surface of the first IC chip is the preselected first distance from the top surface of the circuit board in the direction generally normal to the top surfaces of the first IC chip and the circuit board.

13. The mounting assembly of claim 12, wherein d3 is greater than d1 and less than d2.

14. The mounting assembly of claim 12, wherein d3 is greater than d2.

15. The mounting assembly of claim 12, wherein the mounting block is made of a material of high thermal conductivity, and wherein the mounting block acts as a heat spreader and heat dissipation device that spreads and dissipates heat generated by the first and second IC chips.

16. The mounting assembly of claim 1, wherein the mounting block is made of metal.

17. The mounting assembly of claim 1, wherein the first, second and third inside walls of the circuit board have a castellation formed therein where portions of the inside walls of the circuit board have been removed to form grooves in the inside walls of the circuit board in directions generally normal to the top and bottom surfaces of the circuit board, the grooves formed in the inside walls being separated by flat portions of the inside walls, and wherein an electrically-conductive adhesive material is disposed in the grooves, and wherein the flat portions of the inside walls and the electrically-conductive adhesive material disposed in the grooves are in contact with the adjacent second side walls of the mounting block.

18. The mounting assembly of claim 17, and wherein the mounting block is made of a metallic material or is plated with a metallic material.

19. The mounting assembly of claim 18, wherein the grooves are lined with a metallic material.

20. The mounting assembly of claim 18, wherein each of the grooves is connected to an electrically-conductive trace of the circuit board and wherein each of the electrically conductive traces is part of an electrical ground return path of the mounting assembly.

* * * * *